United States Patent
Zhu et al.

(10) Patent No.: US 9,621,109 B2
(45) Date of Patent: Apr. 11, 2017

(54) AMPLIFIER STRUCTURE

(71) Applicant: Ampleon Netherlands B.V., Nijmegen (NL)

(72) Inventors: Yi Zhu, Nijmegen (NL); Josephus van der Zanden, Nijmegen (NL); Kanjun Shi, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 15 days.

(21) Appl. No.: 14/635,269

(22) Filed: Mar. 2, 2015

(65) Prior Publication Data

US 2015/0256130 A1    Sep. 10, 2015

(30) Foreign Application Priority Data

Mar. 4, 2014  (EP) .................................... 14157723

(51) Int. Cl.
*H03F 3/04* (2006.01)
*H03F 1/02* (2006.01)
*H01L 25/07* (2006.01)
*H03F 3/193* (2006.01)
*H03F 3/21* (2006.01)

(52) U.S. Cl.
CPC ......... *H03F 1/0205* (2013.01); *H01L 25/072* (2013.01); *H03F 3/193* (2013.01); *H03F 3/21* (2013.01); *H01L 2224/49175* (2013.01); *H03F 2200/451* (2013.01); *H03F 2200/555* (2013.01)

(58) Field of Classification Search
CPC ...................................................... H03F 3/04
USPC ................................................ 330/296, 285
See application file for complete search history.

(56) References Cited

U.S. PATENT DOCUMENTS

| | | | |
|---|---|---|---|
| 6,734,728 B1 | 5/2004 | Leighton et al. | |
| 7,345,537 B2 * | 3/2008 | Apel ..................... | H03F 1/0244 330/124 D |
| 8,131,251 B2 * | 3/2012 | Burgener ............... | H01Q 23/00 455/127.3 |
| 8,649,754 B2 * | 2/2014 | Burgener ............... | H01Q 23/00 455/127.3 |
| 2004/0188706 A1 | 9/2004 | Chang et al. | |

FOREIGN PATENT DOCUMENTS

EP    2 521 257 A1    11/2012

OTHER PUBLICATIONS

Extended European Search Report for application 14157723.9 (Oct. 29, 2014).

* cited by examiner

*Primary Examiner* — Henry Choe
(74) *Attorney, Agent, or Firm* — McDonnell Boehnen Hulbert & Berghoff LLP

(57) ABSTRACT

An amplifier structure comprising a transistor element having a plurality of sub-sections arranged adjacent to one another along a transistor element axis, a bias distribution element comprising a first part and a second part, the first part configured to receive a bias signal and the second part configured to supply the bias signal to each of the sub-sections of the transistor stage, wherein the first part is configured and arranged to deliver the bias signal to a distribution point and the second part is configured to diverge from the distribution point to provide the bias signal to each of the sub-sections of the transistor element, the distribution point arranged substantially facing a center point of the transistor element axis.

14 Claims, 3 Drawing Sheets

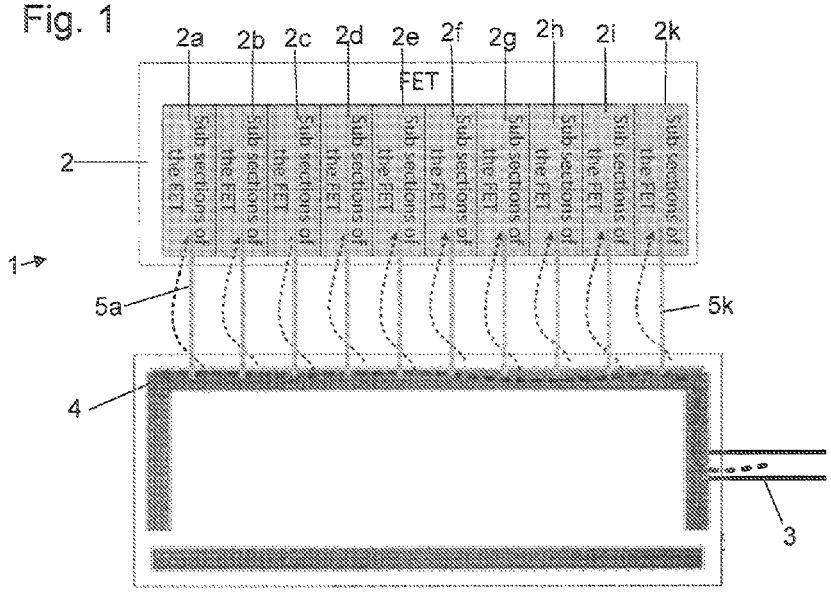
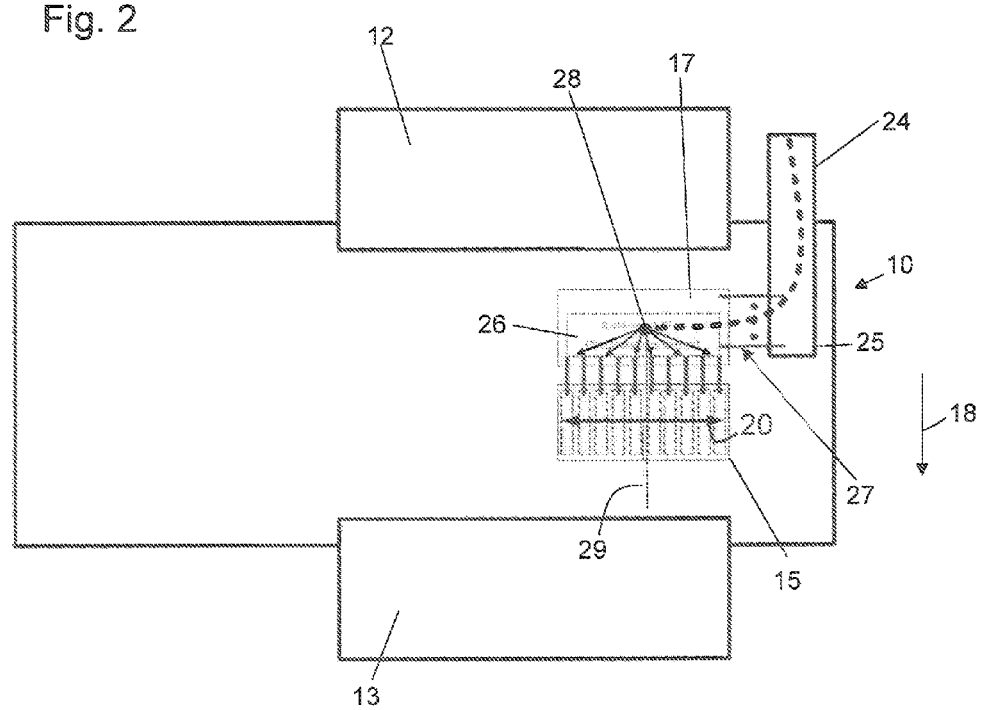

AMPLIFIER STRUCTURE

CROSS-REFERENCE TO RELATED APPLICATIONS

This application claims the priority under 35 U.S.C. §119 of European patent application no. 14157723.9, filed on Mar. 4, 2014, the contents of which are incorporated by reference herein.

This invention relates to an amplifier structure and, in particular, it relates to a RF power amplifier structure. It also relates to an integrated circuit comprising said amplifier.

An amplifier, such as an RF power amplifier or RF power transistor, is used to amplify signals. A typical amplifier structure comprises a transistor, such as a field effect transistor (FET), having an input impedance matching network at its input (i.e. a gate terminal) and an output impedance matching network at its output (i.e. a drain terminal). The FET may be fabricated with various technologies such as LDMOS, GaN, or GaAs. The transistor and its associated impedance matching networks are typically provided on a substrate within a package having an input lead for providing an input signal to the amplifier structure and an output lead for receiving the amplified signal from the amplifier structure. The input and/or output of the transistor may each be coupled to a bias circuit. The bias circuit may be configured to apply a DC bias voltage to the input/output of the transistor.

The transistor may comprise a plurality of sub-sections that each receive the DC bias voltage. It has been found that how the DC bias voltage is delivered to the subsections can affect the performance of the amplifier structure.

According to a first aspect of the invention we provide an amplifier structure comprising a transistor element having a plurality of sub-sections arranged adjacent to one another along a transistor element axis, a bias distribution element comprising a first part and a second part, the first part configured to receive a bias signal and the second part configured to supply the bias signal to each of the sub-sections of the transistor stage, wherein the first part is configured and arranged to deliver the bias signal to a distribution point and the second part is configured to diverge from the distribution point to provide the bias signal to each of the sub-sections of the transistor element, the distribution point arranged substantially facing a centre point of the transistor element axis.

This is advantageous as the first part is configured to provide a current path for the bias signal that is common to all of the subsections. The first part carries the bias signal to the distribution point located at a centre point of the transistor element. The second part then fans out or diverges from the distribution point to supply the transistor element subsections with the bias signal. The second part may define a plurality of separate current paths. However, as the current paths diverge from a central point, the range of resistances of the current paths is low. This configuration keeps the differences in bias signal voltage received at each of the subsections low such that they are substantially equal. This results in an efficient and high performance RF power amplifier. It will be appreciated that the second part may or may not provide the bias signal directly to each of the sub-sections of the transistor element. For example, the second part may include a connection(s), such as bond wires, that connects directly to the subsections or, alternatively, the second part may include a connection that connects to a further component before a further connection couples to the subsections.

The bias signal may comprise a bias voltage signal or a bias current signal.

The first part may comprise an elongate part having a first end, aligned with an end of the transistor element axis, that extends at least to the distribution point, the first end configured to receive the bias signal and may provide a common current path for the bias signal. Thus, the first part may define a current path common to all of the subsections to transfer the DC bias signal from wherever it is supplied to the amplifier structure to the distribution point.

At least two arms may diverge from the distribution point, each arm configured to provide the bias signal to a subset of the transistor sub-sections. Thus the second part may comprise two or more arms that extend in different directions from the distribution point, the arms providing separate current paths for delivering the DC bias signal to each of or subsets of the transistor sub-sections.

The arms may include bond wires extending therefrom to provide a connection from the arms to one or more of the transistor sub-sections. Thus, bond wires may extend from ends of the arms distal from the distribution point to form connections to the sub-sections of the transistor element.

The second part may include two arms arranged to diverge and extend in the direction of opposite ends of the transistor element axis. The arms may extend in opposite directions to distribute the DC bias signal to different halves of the transistor element. In particular, a first arm may be configured to provide the bias signal to half of the subsections located at one end of the transistor element axis and a second arm may be configured to provide the bias signal to the other half of the subsections located at the other end of the transistor element axis.

The or each arm may include a further branching point from which at least two further arms extend, the further arms arranged to diverge from the branching point. This is advantageous as the further branching of the arms to form a greater number of secondary arms allows finer control of the resistive length of the current paths that deliver the DC bias signal to the subsections.

The second part may include a distribution bar extending substantially the width of the transistor element and parallel with the transistor element axis, the arms or further arms connected to the distribution bar at spaced locations therealong. In particular, the arms or further arms may be evenly spaced along the distribution bar. The distribution bar may electrically connect the arms or further arms and provides a bar from which connections to the terminals of the transistor subsections can be made. Thus, the terminals of the transistor subsections may be aligned with the distribution bar such that there is a substantially equal spacing between each of the terminals and the straight distribution bar.

The arms may be provided in a first semiconductor metal layer and the further arms may be provided in a second semiconductor metal layer, the first and second semiconductor metal layers spaced from one another. Using integrated circuit fabrication techniques, the bias distribution element may be constructed over multiple metal layers in a semiconductor material. The semiconductor material may also include the transistor element and/or an impedance matching network associated with the transistor element.

The second part may comprises a plurality arms extending radially from the distribution point. The arms may extend in equally angularly spaced directions. The arms may be provided by groups of bond wires.

The bias distribution element may be provided by metal tracks formed in a metal layer. Thus, a metal layer may be etched with a pattern that defines the bias distribution element.

The second part may include a distribution bar extending substantially the width of the transistor element and parallel with the transistor element axis, and the arms may be provided by a plurality of bond wires extending from the distribution point to spaced locations along the distribution bar. The bond wires may be arranged to provide a uniform current density along the distribution bar such that the DC bias signal received by each of the subsections is substantially uniform. Thus, the number of bond wires or the distribution of bond wires may vary along the length of the distribution bar. For example, the density of bond wire connections at positions along the distribution bar may vary as a function of the distance the particular position is from the distribution point. Thus, the further from the distribution point, the greater the number of bond wire connections may be provided. The bond wires may be arranged in groups and therefore a group of bond wires that connect to a position along the distribution bar further from the distribution point than a group that connect to a position closer to the distribution point may include a greater number of bond wires.

The arms of the second part may be shaped or sized to have a resistance as a function of their length from the distribution point. This is advantageous because the arms may, in certain configurations, have slightly different lengths, the resistance of some of the current paths that serve some of the subsections may differ. By compensating for differences in the length of the arms by sizing the width, for example, of the metal tracks that define the arms, a more uniform DC bias signal can be presented to the subsections.

The distribution bar may include a plurality of transistor bond wires providing a connection to each of the transistor sub-sections. The bond wires may extend perpendicular to the distribution bar.

The distribution element may be formed as a pattern in a metal layer of a further semiconductor component of the amplifier structure. For example, the bias distribution element may be formed in a metal layer of a DC blocking capacitor, which may form part of an impedance matching network of the transistor element. Alternatively, the bias distribution element may be formed as part of or on a MOS capacitor, MIMCAP, which may be part of an impedance matching network, or on a metal layer (or over several layers) of an integrated amplifier structure.

According to a second aspect of the invention we provide an integrated circuit (IC) including the amplifier structure as defined in the first aspect.

According to a third aspect of the invention we provide a wireless communication device including the amplifier structure as defined in the first aspect.

BRIEF DESCRIPTION OF THE DRAWINGS

There now follows, by way of example only, a detailed description of embodiments of the invention with reference to the following figures, in which:

FIG. 1 shows part of a known amplifier structure;
FIG. 2 shows a schematic view of an example amplifier structure formed in a package.

Figure 3:
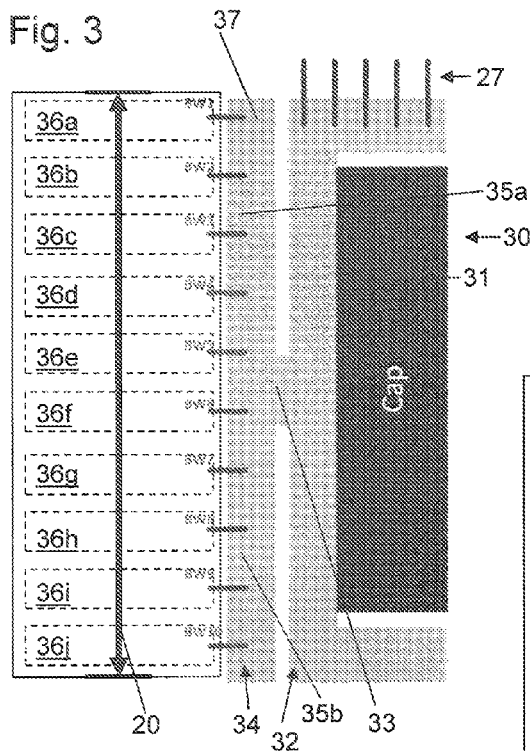
FIG. 3 shows a second example amplifier structure.

The examples disclosed herein relate to an amplifier structure and, in particular, a RF power transistor structure. The amplifier structure may comprise a FET having impedance matching networks at its input side or gate terminal and its output side or drain terminal. It is common for such amplifier structures to be formed on a substrate or die and mounted within a package. The package includes leads that provides a connection to/from the package and the impedance matching networks and transistor therein. Amplifier structures typically receive a bias signal comprising a DC bias voltage applied at the input lead and/or at an output lead.

DETAILED DESCRIPTION

FIG. 1 shows a known amplifier structure 1 comprising a FET 2 having a plurality of subsections 2a-k extending side by side over the width of the FET 2. A DC bias voltage is applied to each subsection 2a-k. The DC bias voltage is supplied from a DC bias circuit (not shown) by a DC bias lead which, by way of bondwires 3, connects to a metal track 4. The metal track 4 is elongate and faces the subsections of the FET 2 and extends parallel thereto. Each connection between the metal track 4 and one of the subsections 2a-k is provided by a bond wire 5a-k. The bond wires 5a-k extend from their associated subsection 2a-k to the metal track 4 at spaced locations therealong corresponding to the spacing between the subsections 2a-k.

The resistive length of current path to subsection 2k from the bondwires 3 is less than the resistive length of the current path to subsection 2a from the bondwires 3. This has been found to affect the bias voltage applied at each of the subsections 2a-k. The disparity between the bias voltage applied at one subsection 2a to another subsection 2k has been found to detrimentally affect the performance of the amplifier structure.

FIG. 2 shows a schematic view of an example amplifier structure 10 mounted within a package. The package includes a drain lead 12 and a gate lead 13, which provide the input and output to the amplifier structure 10 within. In this example, the amplifier structure comprises an LDMOS FETs 15 having an associated impedance matching network 17. It will be appreciated that other fabrication technologies may be used other than LDMOS. The FET 15 includes a plurality of subsections (shown in dashed lines). The direction of current flow through the FET 15 is generally shown by arrow 18. The subsections are arranged side by side along an axis 20 perpendicular to the general direction of current flow between the gate and drain terminals of the FET subsections. The connections between the leads 12, 13, impedance matching network 17 and the FET 15 are not shown for clarity.

The package further includes a DC supply lead 24 which receives a DC voltage for providing a bias signal to the FETs 14, 15. The lead 24 has a terminal end 25 arranged at a side of the impedance matching network 17, adjacent an end of the axis 20 along which the subsections are distributed. The impedance matching network 17 includes a metal layer thereon, which is used to supply the DC bias signal from the lead 24 to the amplifier structure 10. In particular, in this example, the metal layer is used to provide a bias distribution element 26 or bias distribution conductive pattern (by a configuration of conductive and non-conductive portions) to receive the bias signal from the lead 24 and provide it to the FET 15. It will be appreciated that the bias distribution element 26 need not be formed in a metal layer on the, or part, of the impedance matching network 17 and could be a separate part. For example, it may be formed in or on the silicon substrate of the FET 15. Bond wires 27 connect the terminal end of the lead 24 to the bias distribution element 26. It will be appreciated that any number of bond wires 27 may be used. The bias distribution element is configured and/or arranged to provide a current path between the terminal end 25 of the lead 24 to each of the subsections of the FET 15 that has a substantially equal resistance. This is advantageous as the DC bias voltage applied at each of the subsections will be substantially equal, which has been found to improve the performance and reliability of the amplifier structure 10. This may be achieved by the bias distribution element 26 providing a current path common to all of the subsections that extends to a distribution point 28 that is aligned with a centre point 29 along the axis 20. Separate current paths for each subsection or current paths common to groups or subsets of subsections may then diverge from the distribution point to provide the DC bias signal to the subsections.

FIG. 3 shows an example bias distribution element 30. In this example, the bias distribution element 30 is associated with a capacitor 31 of an impedance matching network associated with the FET. The bias distribution element 30 is configured to deliver the bias signal to each of the subsections 36a-j. The bias distribution element 30 comprises a first part 32 that receives a DC bias signal from a bias circuit (not shown) via bond wires 27. Similar to the previous example, the first part 32 receives the bias signal at a side of the transistor (relative to the current flow through the transistor) from a terminal end of a bias signal lead (not shown but bond wires 27 will connect to said terminal end). The first part provides a common current path for the DC bias signal for the subsections of the FET. The first part 32 extends to a distribution point 33. The distribution point 33 is aligned with a centre point of the FET subsections. In this example, the first part 32 extends the width of the FET subsections 36a-j and the distribution point 33 is located halfway along the first part 32. As the first part 32 extends across the width of the FET subsections or amplifier structure, the first part comprises a convenient conductive member to transfer the bias signal to further components. For example, two dies, each containing an amplifier structure, may be mounted in a package. The bias signal may be received by the first part of one of the amplifier structures at a first end. As the first part extends across the first amplifier arrangement, a connection between the second end (opposite end to the first side) of the first part of the first amplifier structure and the first part of the second amplifier structure can be made by bond wires, for example. Thus, the first part may provide an interconnection point for transferring the bias signal to a further amplifier structure. This may obviate the need for a second DC bias lead in the package.

The bias distribution element 30 includes a second part 34 electrically connected to the first part 32 at the distribution point 33. The second part may only be connected to the first part at the distribution point. The second part 34 diverges from the distribution point to supply the DC bias signal to each of the sub-sections. In this example, the second part comprises two arms 35a and 35b that extend in substantially opposite directions from the distribution point 33. The arm 35a extends in a direction of one end of the plurality of subsections and the arm 35b extends in a direction of the other, opposite end of the plurality of subsections. In this embodiment, the arms 35a, 35b form a distribution bar 37 that extends the width of the transistor subsections 36a-j and adjacent to but spaced from said subsections and, in particular, from the gate or drain terminals of said subsections. The distribution bar 37 is arranged parallel to the axis 20 along which the subsections 36a-j are distributed. Bond wires BW1-BW10 extend from the distribution bar 37 at evenly spaced locations therealong to provide a connection to each of the subsections 36a-j. Thus, each of the bond wires BW1-BW10 extend from a position along the distribution bar 37 opposite the terminal (gate or drain, for example) of the subsection 36a-j to which the bond wire is connected.

The length of the current paths from the bond wires 33 to each of the subsections 36a-j is substantially equal compared to the arrangement of FIG. 1. Accordingly the difference in the voltage drop in the bias signal experienced by the subsections will be reduced.

Figure 4:
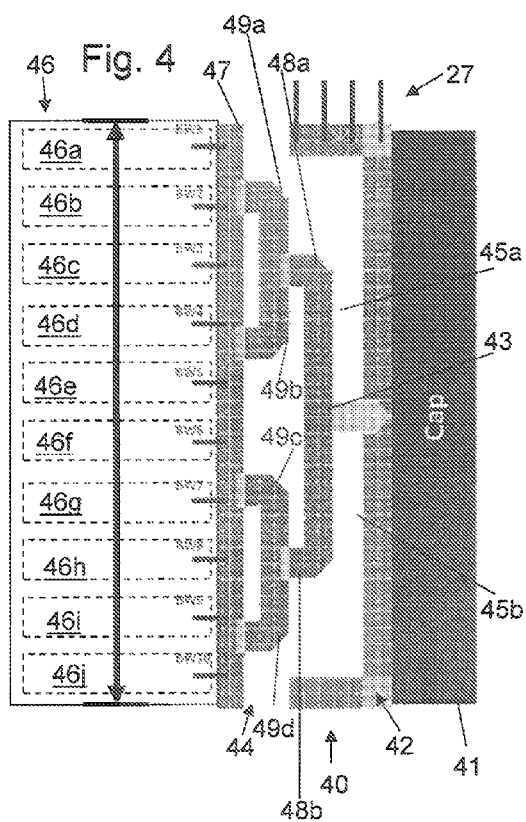
FIG. 4 shows a third example amplifier structure.

FIG. 4 shows a further example configuration for the bias distribution element 40. In this example, the bias distribution element 40 has at least two branching points as will be described below. The branching points allow for finer control of the resistance range of the current paths that supply the subsections 46a-j. The bias distribution element 40 is associated with a capacitor 41 of an impedance matching network associated with the FET. The bias distribution element 40 is configured to deliver the bias signal to each of the subsections 46a-j. The bias distribution element 40 comprises a first part 42 and a second part 44. The first part receives a DC bias signal from a bias circuit (not shown) via bond wires 27. The first part 42 receives the bias signal at a side of the transistor 46 (a side relative to the current flow through the transistor) from a terminal end of a bias signal lead (not shown but bond wires 27 will connect to said terminal end). The first part provides a common current path for the DC bias signal for the subsections 46a-j of the FET. The first part 42 extends to a distribution point 43. The distribution point 43 is aligned with a centre point of the FET subsections 46a-j. In this example, the first part 42 extends the width of the FET subsections 46a-j and the distribution point 43 is located halfway along the first part 42.

The second part 44 extends from the distribution point 43 to the subsections 46a-j. The second part 43 includes two primary arms 45a and 45b that diverge from the distribution point and extend in substantially opposite directions therefrom. The primary arm 45a extends in a direction of one end of the plurality of subsections and the primary arm 45b extends in a direction of the other, opposite end of the plurality of subsections. In this embodiment, distal ends of each of the primary arms 45a, 45b includes a branching point 48a, 48b. At the branching point 48a, the primary arm 45a splits into two secondary arms 49a, 49b. The secondary arms 49a, 49b extend in substantially opposite directions towards opposite ends of the row of subsections 46a-j. Likewise, at the branching point 48b, the primary arm 45b splits into two secondary arms 49c, 49d. The secondary arms 49c, 49d extend in substantially opposite directions towards opposite ends of the row of subsections 46a-j. The distal ends of the secondary arms 49a-d connect to a distribution bar 47. The distribution bar 47 is arranged parallel to the axis 20 along which the subsections 46a-j are distributed. Bond wires BW1-BW10 extend from the distribution bar 47 at evenly spaced locations therealong to provide a connection to each of the subsections 46a-j. Thus, each of the bond wires BW1-BW10 extend from a position along the distribution bar 47 opposite the terminal (gate or drain, for example) of the subsection 36a-j to which the bond wire is connected. Further, the distal ends of the secondary arms 49a-d are distributed such that they connect to the distribution bar 47 at evenly spaced locations. Thus, the arms 48a, 48b, 49a-d provide a current path of a substantially uniform length and therefore substantially uniform resistance for each of the subsections 46a-j.

Figure 5:
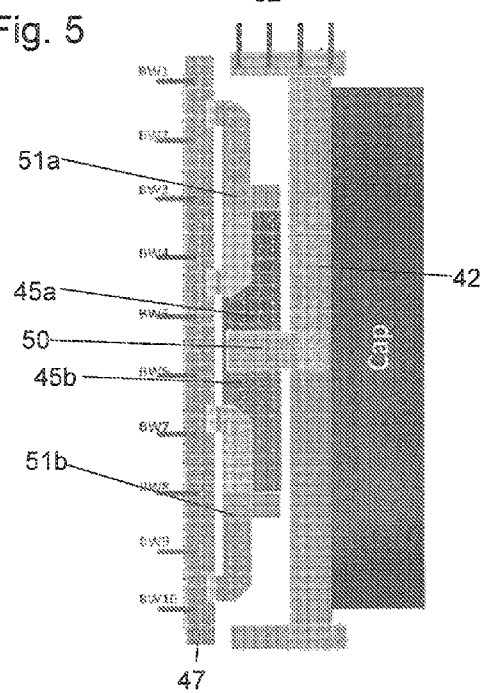
FIG. 5 shows a fourth example amplifier structure.
Figure 6:
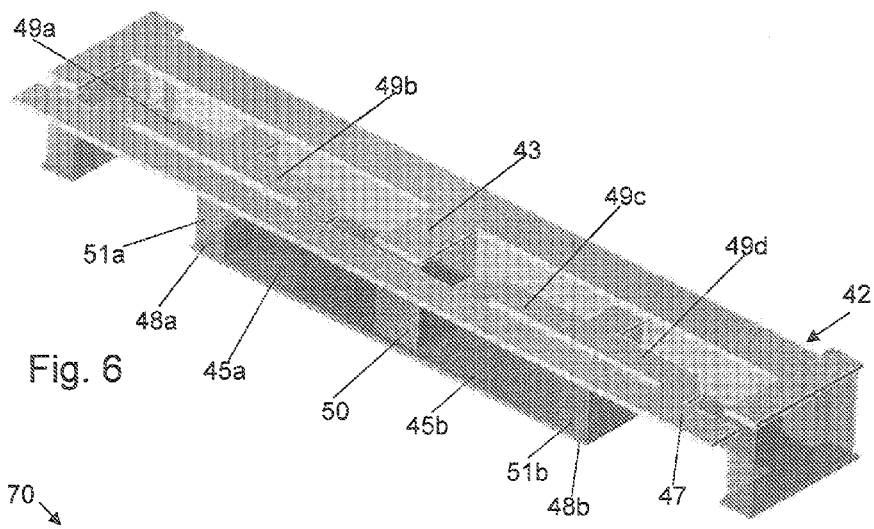
FIG. 6 shows a perspective view of the amplifier structure of FIG. 5.

FIGS. 5 and 6 show a modification to the arrangement presented in FIG. 4. In FIGS. 5 and 6, the primary 45a, 45b and secondary arms 49a-d are provided in different metal layers of a substrate. The first part 42 is as described in relation to FIG. 4. However, at the distribution point 43, a via 50 is provided to a lower metal layer. The primary arms 45a, 45b extend from the via 50 in the lower layer. At the distal ends of the primary arms 45a, 45b, at each of the branching points 48a, 48b, a further via 51a, 51b is provided that extends back up to the upper layer, in which the primary part 42 extends. The secondary arms 49a, 49b extend from the via 51a and the secondary arms 49c, 49d extend from the via 51b. The distal ends of the secondary arms 49a-d connect to a distribution bar 47, similar to the arrangement in FIG. 4. By providing the branching primary arms 45a, 45b and secondary arms 49a-d in different layers allows the arrangement to be more compact and thus consume less semiconductor area.

It will be appreciated that tertiary arms may branch from the secondary arms and so on. Further, more than two arms may branch from the distribution point 43 and/or each branching point 48a, 49b. Each "generation" of arms may extend in a different layer or may alternate between upper and lower layers.

Figure 7:
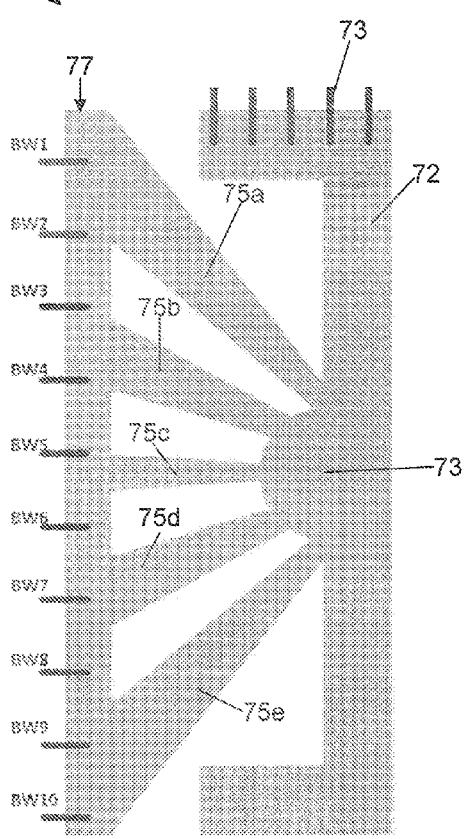
FIG. 7 shows a fifth example amplifier structure.

FIG. 7 shows a further example of a bias distribution element 70. In this example, the bias distribution element 70 is formed on a metal layer of an integrated circuit which connects to the FET by bond wires. The bias distribution element 70 comprises a first part 72 that receives a DC bias signal from a bias circuit (not shown) via bond wires 73. Similar to the previous examples, the first part 72 receives the bias signal off centre of the transistor from a terminal end of a bias signal lead (not shown but bond wires 73 will connect to said terminal end). The first part provides a common current path for the DC bias signal for the subsections of the FET. The first part 72 extends to a distribution point 73. The distribution point 73 is aligned with a centre point of the FET subsections. The first part 72 extends the width of the FET subsections and the distribution point 73 is located halfway along the first part 72. In this example, the distribution point 73 comprises a semi-circular projection from the first part 72. From this projection extends a plurality of arms 75a-e or "spokes". The arms 75a-e extend towards a distribution bar 77. In particular, the arms extend radially at angularly spaced locations from the distribution point 73. In this example five arms are provided but more or less may be present. Further, rather than connect to a distribution bar 77, the arms may extend such that they terminate adjacent each of the transistor subsections or adjacent pairs of subsections.

The resistance of each arm may be controlled, such as by controlling the width of the metal track that defines the arm. Thus, the arms 75a, 75e, which are longer than the arm 75c for example may be wider or thicker. The wider or thicker arms may have less resistance than a narrower or thinner arm and therefore the width or thickness of the arms may compensate for any extra length the arms must extend to reach the distribution bar 77. As in previous example, the distribution bar 77 includes a plurality of bond wires BW1-BW10 for connecting the distribution bar 77 to each of the transistor subsections. As in previous examples, the distribution bar is aligned with the terminals (gate or drain) of the transistor subsections, and therefore the bond wires BW1-BW10 are of all the same length.

It will be appreciated that different arms, such as adjacent arms, may be provided in different metal layers. Thus, a first set of arms may be interleaved (at least in plan view) with a second set of arms, wherein the first set and second set extend in different layers.

Figure 8:
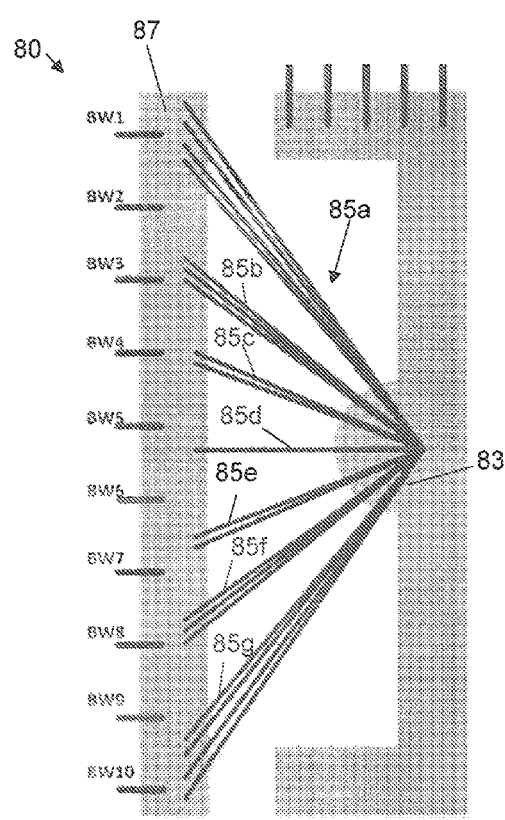
FIG. 8 shows a sixth example amplifier structure.

FIG. 8 shows a further example of a bias distribution element 80. The bias distribution element 80 is substantially similar to the bias distribution element 70 of FIG. 7. However, in this example, the arms are provided by bond wires 85a-g rather than by etched metal tracks. Further seven bond wire groups are provided to define seven arms. In the previous example, the width of the arms was used to "fine tune" the resistance of the current flow path through the arms based on the length of each arm. In this embodiment, the number of bond wires used to form each arm i,e. the connection between the distribution point 83 and the distribution bar 87 is determined to fine-tune the resistance of each arm based on its length. Accordingly, the outer arms 85a and 85g are defined by four bond wires each, arranged in a group. The arms 85b, 85f are defined by three bond wires each, arranged in a group. The arms 85c, 85e are defined by two bond wires each, arranged in a group. The arm 85d is provided by a single bond wire. It will be appreciated that different numbers of bond wires may be used for each arm as well as a different relationships between the number of bond wires and the length of the connection between the distribution point 83 and the distribution bar 87. Further, fine-tuning of the resistance may be achieved by control of the bond wires' length by way of the height and/or shape of the bond wires. The bond wire length may be used to tune the resistance in addition to the number of bond wires used in each group or not.

While the invention described above is implemented in semiconductor technology, the invention may be applied to other technologies such as Low temperature Co-fired Ceramic (LTCC). The bias signal may be applied from a die adjacent to the die having the amplifier structure thereon. A package may incorporate more than one of said amplifier structures and the bias signal may be applied across the first parts in series. In the above embodiments, the bias distribution element is shown between the amplifier or FET and a capacitor (shown as cap). However, the capacitor may located between the bias distribution element and the amplifier. Thus, the second part of the bias distribution element may or may not directly connect via bond wires to the subsections of the transistor. Instead, bond wires from the second part may extend to the subsections via a further component such as the cap. It will be appreciated that provided the resistive length of the connections (fully or in part provided by bond wires) that leave the second part to the amplifier/transistor subsections are substantially equal, the advantages of the invention are achieved.

The invention claimed is:

1. An amplifier structure comprising a transistor element having a plurality of sub-sections each having a respective output terminal and arranged adjacent to one another along a transistor element axis, a bias distribution element comprising a first part and a second part, the first part configured to receive a bias signal and the second part configured to supply the bias signal to the respective output terminal of each of the sub-sections of the transistor element, wherein the first part is configured and arranged to deliver the bias signal to a distribution point and the second part is configured to diverge from the distribution point to provide the bias signal to each of the sub-sections of the transistor element, the distribution point arranged substantially facing a center point of the transistor element axis, wherein the first part comprises an elongate part having a first end, said first part extending at least to the distribution point, wherein the first end is configured to receive the bias signal, and wherein the first part provides a common current path for the bias signals intended for each of the sub-sections.

2. An amplifier structure according to claim 1, in which at least two arms diverge from the distribution point, each arm configured to provide the bias signal to a subset of the transistor sub-sections.

3. An amplifier structure according to claim 2, in which the arms include bond wires extending therefrom to provide a connection from the arms to one or more of the transistor sub-sections.

4. An amplifier structure according to claim 2, in which the second part includes two arms arranged to diverge and extend in the direction of opposite ends of the transistor element axis.

5. An amplifier structure according to claim 2, in which at least one arm includes a further branching point from which at least two further arms extend, the further arms arranged to diverge from the branching point.

6. An amplifier structure according to claim 5, in which the arms are provided in a first metal layer and the further arms are provided in a second metal layer, the first and second metal layers spaced from one another.

7. An amplifier structure according to claim 1, in which the second part comprises a plurality arms extending radially from the distribution point.

8. An amplifier structure according to claim 2, in which the second part includes a distribution bar extending substantially the width of the transistor element and parallel with the transistor element axis, and the arms are formed by a plurality of bond wires extending from the distribution point to spaced locations along the distribution bar.

9. An amplifier structure according to claim 2, in which the arms and/or further arms of the second part are shaped or sized to have a resistance as a function of their length from the distribution point.

10. An amplifier structure according to claim 2, in which the second part includes a distribution bar extending substantially the width of the transistor element and parallel with the transistor element axis, the arms or further arms connected to the distribution bar at spaced locations therealong.

11. An amplifier structure according to claim 10, in which the distribution bar includes a plurality of transistor bond wires providing a connection to each of the transistor sub-sections.

12. An amplifier structure according to claim 1, in which the bias distribution element is formed as a pattern in a metal layer of a further component of the amplifier structure.

13. An integrated circuit comprising the amplifier structure claim 1.

14. A wireless communication device including the amplifier structure of claim 1.

* * * * *